United States Patent
Laporte et al.

(10) Patent No.: US 9,240,766 B2
(45) Date of Patent: Jan. 19, 2016

(54) WIDE-BAND COUPLER

(71) Applicant: STMicroelectronics (Tours) SAS, Tours (FR)

(72) Inventors: Claire Laporte, Tours (FR); Hilal Ezzeddine, Tours (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 134 days.

(21) Appl. No.: 14/227,532

(22) Filed: Mar. 27, 2014

(65) Prior Publication Data

US 2014/0292614 A1 Oct. 2, 2014

(30) Foreign Application Priority Data

Mar. 29, 2013 (FR) ..................................... 13 52892

(51) Int. Cl.
*H03H 7/46* (2006.01)
*H01P 5/18* (2006.01)
*H03F 3/195* (2006.01)
*H03F 3/24* (2006.01)
*H04B 1/04* (2006.01)

(52) U.S. Cl.
CPC ................ *H03H 7/468* (2013.01); *H01P 5/18* (2013.01); *H03F 3/195* (2013.01); *H03F 3/245* (2013.01); *H03F 2200/171* (2013.01); *H03F 2200/204* (2013.01); *H03F 2200/207* (2013.01); *H03F 2200/414* (2013.01); *H04B 2001/0408* (2013.01)

(58) Field of Classification Search
CPC ............ H03H 7/42; H03H 7/468; H01P 5/10; H01P 5/16; H01P 5/18
USPC ..................................... 333/109–123, 25, 26
See application file for complete search history.

(56) References Cited

U.S. PATENT DOCUMENTS

| | | | | | |
|---|---|---|---|---|---|
| 3,988,705 | A | * | 10/1976 | Drapac ..................... | H01P 5/16 333/109 |
| 7,218,186 | B2 | * | 5/2007 | Chen ....................... | H01P 5/185 333/116 |
| 8,471,648 | B2 | * | 6/2013 | Rijssemus ................ | H03H 7/48 333/119 |
| 8,565,695 | B2 | * | 10/2013 | Bonnet ..................... | H01P 5/18 333/17.3 |
| 2003/0169123 | A1 | * | 9/2003 | Eihama .................. | H03F 1/3229 333/29 R |
| 2007/0194886 | A1 | * | 8/2007 | Bang ..................... | G06K 7/0008 340/10.1 |
| 2011/0001575 | A1 | | 1/2011 | Laporte et al. | |
| 2011/0057746 | A1 | | 3/2011 | Yamamoto et al. | |
| 2012/0122410 | A1 | | 5/2012 | Laporte et al. | |
| 2013/0038403 | A1 | * | 2/2013 | Colleoni ............. | H04L 25/0272 333/109 |

FOREIGN PATENT DOCUMENTS

EP 2551952 A2 7/2012

OTHER PUBLICATIONS

French Search Report and Written Opinion dated Dec. 11, 2013 from corresponding French Application No. 13/52892.

* cited by examiner

*Primary Examiner* — Dean Takaoka
*Assistant Examiner* — Alan Wong
(74) *Attorney, Agent, or Firm* — Allen, Dyer, Doppelt, Milbrath & Gilchrist, P.A.

(57) ABSTRACT

A coupling circuit, including: a coupler including a first conductive line and a second conductive line coupled to the first one; at each end of the second line of the coupler, a two-output signal splitter; and at each output of each splitter, a filtering function.

6 Claims, 4 Drawing Sheets

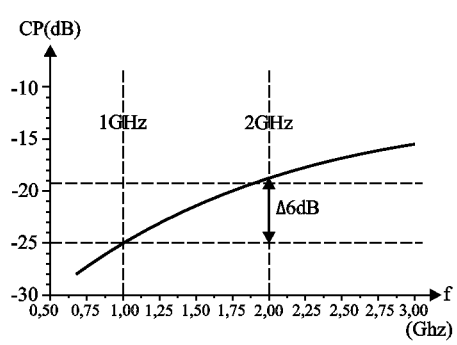
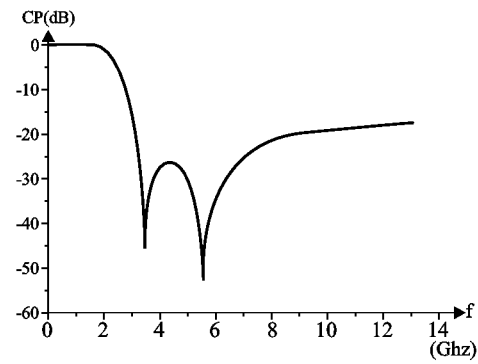
Fig 3A  Fig 3B
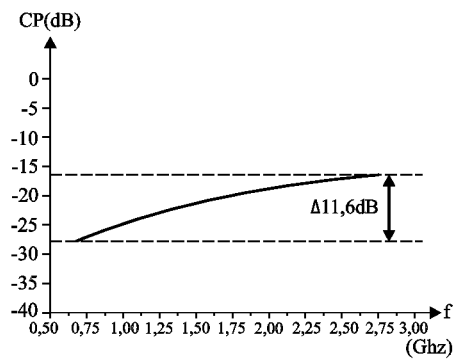
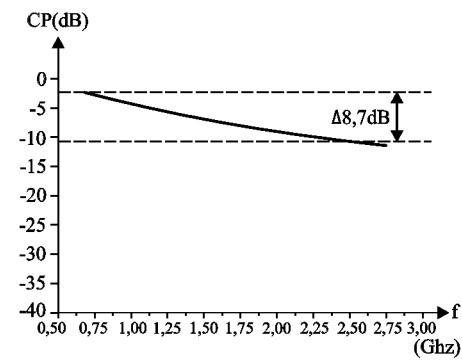
Fig 4A  Fig 4B
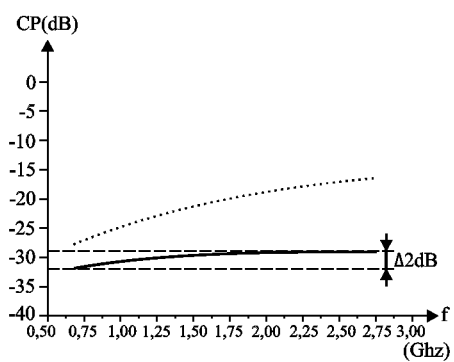
Fig 4C

WIDE-BAND COUPLER

CROSS REFERENCE TO RELATED APPLICATIONS

This application claims the priority benefit of French Patent Application No. 13/52892, filed Mar. 29, 2013, and which application is hereby incorporated by reference to the maximum extent allowable by law.

BACKGROUND

1. Technical Field

The present disclosure generally relates to electronic circuits and, more specifically, to radio transmit-receive chains. The present disclosure more specifically relates to the forming of a wide-band coupler.

2. Discussion of the Related Art

Couplers are circuits intended to extract part of the power conveyed by a transmission line for measurement purposes. In an application to radio transmission chains, the coupler typically has the function of controlling the gain of a transmit amplifier or the parameters of an impedance-matching network according to the response of the antenna.

There are two large categories of couplers. So-called lumped element couplers, which are formed of resistive, inductive, and capacitive components, and so-called distributed couplers, which are formed of coupled conductive lines. The present disclosure relates to the second category of couplers.

The multiplication of frequency bands capable of being processed by telecommunications device raises issues in terms of parasitic coupling between antennas dedicated to these different bands, and in particular when frequency bands overlap.

SUMMARY

An embodiment provides a wide-band coupler which overcomes all or part of the disadvantages of usual couplers.

Another embodiment provides a wide-band coupler having a low transmission loss.

Another embodiment provides a coupler more specifically adapted to mobile telecommunication devices capable of supporting several frequency bands.

An embodiment provides a coupling circuit comprising:

a coupler comprising a first conductive line and a second conductive line coupled to the first one;

at each end of the second line of the coupler, a two-output signal splitter;

at each output of each splitter, a filtering function.

According to an embodiment, the first conductive line of the coupler is intended to be interposed on a transmission line of a radio transmit-receive chain.

According to an embodiment, the respective outputs of the filtering functions are connected to detection circuits, respectively assigned to different radio transmit-receive paths.

According to an embodiment, first outputs of each splitter are processed by a low-pass filter.

According to an embodiment, second outputs of each splitter are processed by a correction filter.

An embodiment also provides a radio transmission chain comprising:

two paths sharing a same antenna; and a coupling circuit such as hereabove.

The foregoing and other features and advantages will be discussed in detail in the following non-limiting description of specific embodiments in connection with the accompanying drawings.

BRIEF DESCRIPTION OF THE DRAWINGS

FIGS. 3A and 3B illustrate the operation of a first coupler of the system of FIG. 2;

FIGS. 4A, 4B, and 4C illustrate the operation of the second coupler of the system of FIG. 2;

DETAILED DESCRIPTION

Figure 1:
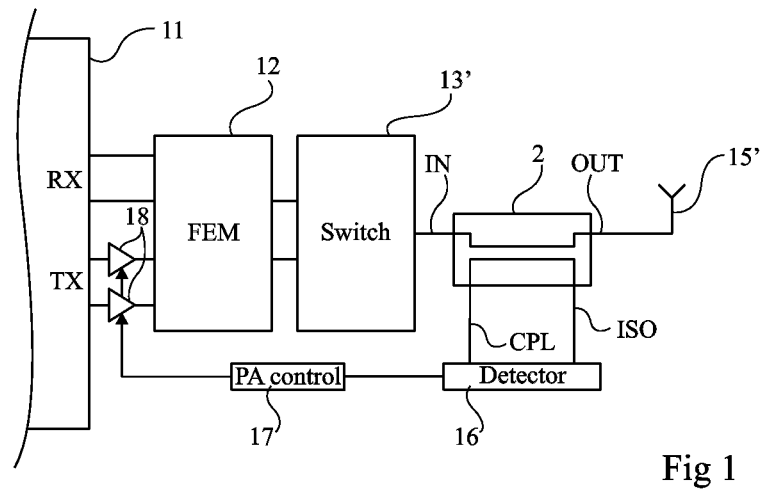
FIG. 1 is a simplified representation in the form of blocks of an example of radio transmission chain of the type to which the embodiments which will be described apply.

The same elements have been designated with the same reference numerals in the different drawings, which are not drawn to scale. For clarity, only those steps and elements which are useful to the understanding of the embodiments to be described have been shown and will be detailed. In particular, the general operation of a radio transmit-receive chain will not be detailed, the described embodiments being compatible with conventional operation. Further, the interpretation and the use made of the signals provided by the coupler have not been detailed either such a use being here again compatible with conventional uses.

FIG. 1 is a simplified representation of an example of a radio transmit-receive chain of the type equipping communication devices, for example, mobile telecommunication devices of cell phone type. Electronic circuits (symbolized by a block 11 in FIG. 1) for generating signals to be transmitted TX and processing received signals RX deliver and receive signals 12 to and from a matching network (FEM—Font End Matching). Although, in the example of FIG. 1, signals RX and TX are processed differentially, other embodiments may be envisaged. A switch 13' in charge of separating the received signals from the transmitted signals is interposed between network 12 and a transmit-receive antenna 15. Further, a coupler 2 is interposed on the transmission line between switch 13' and antenna 15. The function of coupler 2 is to extract part of the power present on the transmission line between circuit 13 and antenna 15 in order, in the shown example, to control the transmit power. The information extracted by coupler 2 is sent to a detector 16 in charge of providing a measurement to a circuit 17 (PA control) for setting the gain of transmit amplifiers 18 (for example, differential). Detector 16, circuit 17, and amplifiers 18 may be integrated to circuit 11.

A distributed coupler comprises two transmission line connection terminals IN and OUT and two terminals CPL and ISO corresponding to the ends of the coupled line, terminal CPL being on the side of terminal IN. Terminals IN and OUT are respectively connected to circuit 13' and to antenna 15. Terminals CPL and ISO are connected to detector 16.

A coupler is characterized by:

its insertion loss, which corresponds to the transmission loss between terminals IN and OUT when terminals CPL and ISO are loaded with a 50-Ω impedance;

its coupling factor, which corresponds to the transmission loss between terminals IN and CPL when terminals OUT and ISO are loaded with a 50-Ω impedance;

its matching, which corresponds to the reflection loss on the four terminals;

its isolation factor, which corresponds to the transmission loss between terminals IN and ISO when terminals OUT and CPL are loaded with a 50-Ω impedance; and its directivity, which defines as the difference in dB between its isolation and coupling factors.

The operation of a coupler is known per se and will not be detailed.

More and more, portable communication devices have increased functionalities regarding the frequency bands that they are capable of processing. In particular, more and more cell phones have functionalities of communication not only over the mobile telephony network (1G, 2G, and 3G) but also on other networks. Further, mobile devices now integrate an additional network (4G or LTE).

A problem posed is the overlapping of the frequency bands processed by such networks. Accordingly, there is an adverse parasitic coupling between antennas dedicated to the different communication systems. In particular, this may disturb the results provided by coupler 2.

A current solution is to use transmit-receive chains different from end to end (comprising different antennas) for the different frequency bands.

However, to gain space in devices, it is desired to pool, between several of these frequency bands, elements of the transmit-receive chain. For example, it may be desired to use a same antenna for all bands 1G to 4G.

Figure 2:
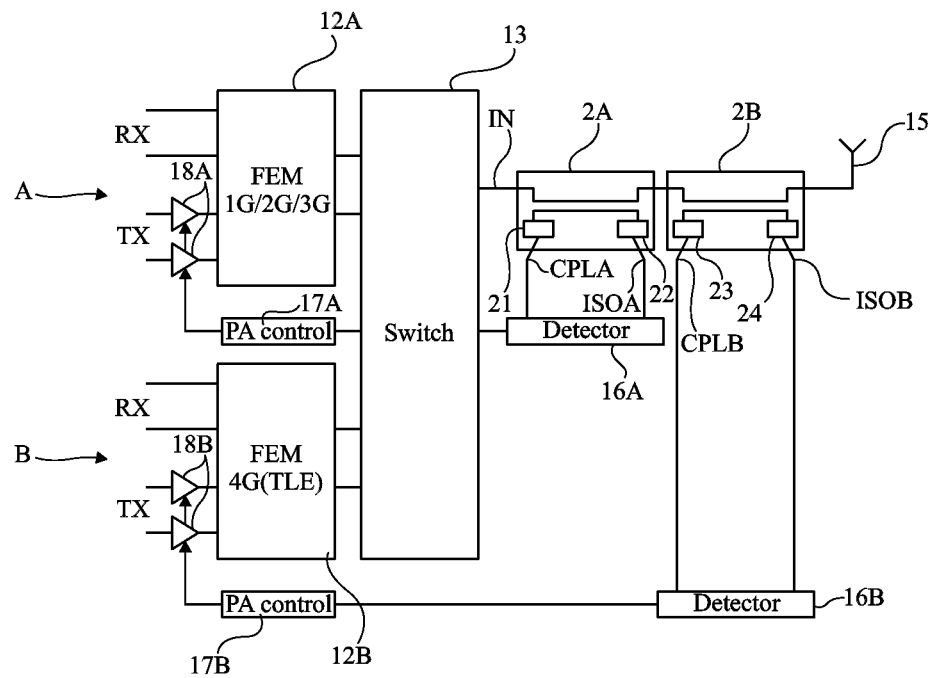
FIG. 2 shows an example of a wide-band coupling system.

FIG. 2 is a simplified representation in the form of blocks of a conventional solution to share a same antenna 15 between two transmit-receive paths A and B. For simplification, circuit 11 has not been illustrated in FIG. 2, this or these circuit(s) being of the same type as that of FIG. 1.

Switch 13 is common to the two paths, each path however having its own network 12A and 12B, its own transmit amplifier 18A and 18B, as well as its own detection circuit 16A, 16B and its own amplitude control circuit 17A, 17B.

The use of a wide-band antenna, in this example antenna 15' common to bands 1G to 4G, may result in an incapacity of coupler (2, FIG. 1) to correctly provide the desired information, and thus in the impossibility of making anything of the signals provided on terminals CPL and ISO. For example, for bands 1G to 3G, it is necessary to remove non-functional frequencies, that is, frequencies greater than 2 GHz, in particular to avoid being disturbed by another frequency band. Indeed, the coupled signal is of low amplitude and cannot be disturbed by parasitic signals having a non-negligible amplitude, even if it is a coupling between antenna 15 and an antenna (not shown) intended for another frequency band. However, in band 4G, the entire 700 MHz band at 2.7 GHz is used. Since it is the useful band, disturbances due to a possible coupling with another frequency band of the same device are negligible.

As illustrated in FIG. 2, two couplers 2A and 2B may be provided in series, each being adapted to the application (the transmit-receive path) for which it is supposed to adjust the transmit amplifier (or a matching network or any other specific function).

Coupler 2A, assigned to the frequency band ranging from 700 MHz to 2 GHz (bands 1G, 2G, and 3G), comprises not only a distributed coupler, but also, on each output of the coupled line, a filter 21, respectively 22, intended to filter frequencies beyond 2 GHz. Thus, the coupled signal, which has a low amplitude with respect to the transmitted signal, is not disturbed by parasitic signals which would otherwise not be negligible, since they are outside of the useful band. Conversely, the signals present in the useful band are not disturbing since, if they originate from a coupling between antennas, they are significantly attenuated.

FIGS. 3A and 3B illustrate the operation of coupler 2A. FIG. 3A shows coupling CP in decibels (dB) versus frequency, generated by the coupler portion alone (coupled lines). FIG. 3B illustrates the coupling at output CPLA (or ISOA) of the coupler, that is, after filtering. The operating range of path A is approximately between 1 and 2 GHz and the variation of the coupling coefficient in this band is on the order of 6 dB (FIG. 3A). When the device operates on a given band (GSM for example), its operating frequency range is further decreased, so that the coupling of the coupler varies little within the operating range. Filters 21 and 22 are of low-pass type and aim at attenuating signals beyond 2 GHz so that detector 16A only sees useful signals.

FIGS. 4A, 4B, and 4C illustrate the operation of coupler 2B assigned to path B (band 4G). The distributed portion of the coupler is similar to that of coupler 2A. Its response (coupling) is illustrated by FIG. 4A. It can be observed that in the frequency range from 700 MHz to 2.7 GHz which forms the operating range of band 4G, the variation of the coupling coefficient exceeds some ten dB, which is too much for the detection to be usable. Accordingly, each end of the coupled line is associated, before respective terminal CPLB and ISOB is reached, with a passive network aiming at attenuating the variation of the coupling coefficient. FIG. 4B illustrates the response of each of circuits 23 and 24 which form correctors of the coupler response. Actually, the frequency response of each network 23 or 24 corresponds to an attenuation which increases as the frequency increases, to have a slope inverse to the variation of the coupling coefficient. This enables to smooth the coupler response. As a result, at outputs CPL and ISO, the obtained coupling coefficient is relatively flat (in the present example, a variation on the order of 2 dB between 700 MHz and 2.7 GHz). Such a response corresponds to the response desired for a coupler assigned to band 4G.

However, an embodiment such as illustrated in FIG. 2 requires two couplers in series, which increases the transmission loss on the main line.

Further, this increases the bulk, since the coupler lines take up significant space.

Figure 5:
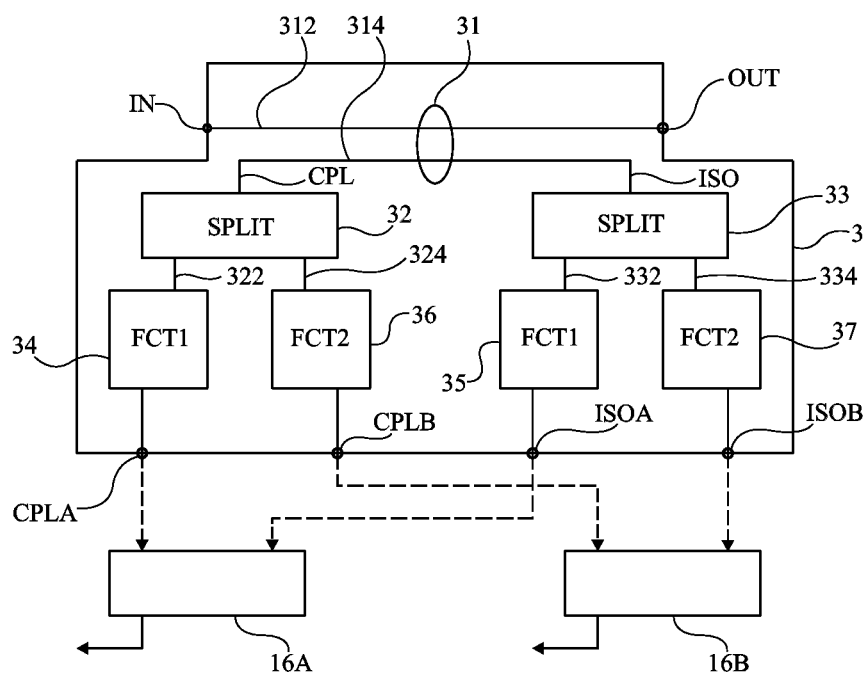
FIG. 5 is a simplified representation of an embodiment of a wide-band coupler.

FIG. 5 is a block diagram of an embodiment of a wide-band coupling circuit having a decreased transmission loss with respect to the series association of the couplers of FIG. 2, and which remains compatible with the use of a single antenna to process two radio transmission paths.

Circuit 3 is intended to replace couplers 2A and 2B, and thus to provide, on outputs CPLA and ISOA, respectively CPLB and ISOB, the signals to be detected to detectors 16A and 16B of paths A and B.

According to this embodiment, circuit 3 comprises a single structure 31 of two coupled lines, similar to that of coupler 2A or of coupler 2B. A first line 312 forms the main line having its ends defining terminals IN and OUT of the coupler, intended to be interposed in the transmission chain between switch 13 (FIG. 2) and antenna 15. Coupled or secondary line 314 of structure 31 has its respective ends CPL and ISO connected to splitters 32 and 33 (SPLIT), preferably identical, in charge of distributing the signal on two outputs 322, 324 and 332, 334 for each of the splitters, each output being assigned to one of paths A or B of the transmission, that is, to one 16A or 16B of the detectors. Outputs 322 and 332 are respectively connected to outputs CPLA and ISOA of circuit 3 by a first filtering function (FCT1), for example, a low-pass filter, respectively 34, 35. Outputs 324 and 334 are respectively connected to outputs CPLB and ISOB of coupler 3 by a second filtering function (FCT2), for example, correction filters 36 and 37.

The forming of low-pass filters 34 and 35 and of correction filters 36 and 37 is inspired by the responses illustrated in relation with FIGS. 3A, 3B, 4A, 4B, and 4C. In practice, circuits 34 to 37 may respectively correspond to circuits 21 to 24 of FIG. 2.

Figure 6:
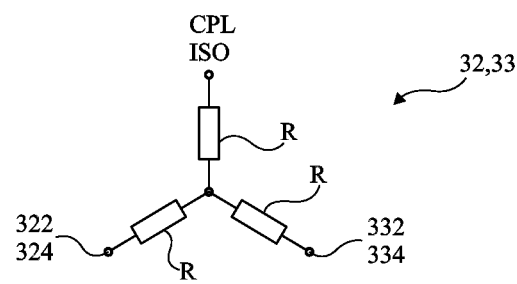
FIG. 6 illustrates an embodiment of a splitter of the coupler of FIG. 5.

FIG. 6 illustrates an embodiment of a splitter circuit 32 or 33 formed of resistive elements. It appears as a star-shaped structure with three branches, having each of its branches comprising a resistive element of same value, the ends of each of the branches being intended to be connected to terminals CPL (respectively ISO), 322 (respectively 342), and 332 (respectively 334). Resistance values R are selected in usual fashion according to the desired impedance (for example, 50 ohms) and each correspond to one third of the value of this normalized impedance.

Figure 7:
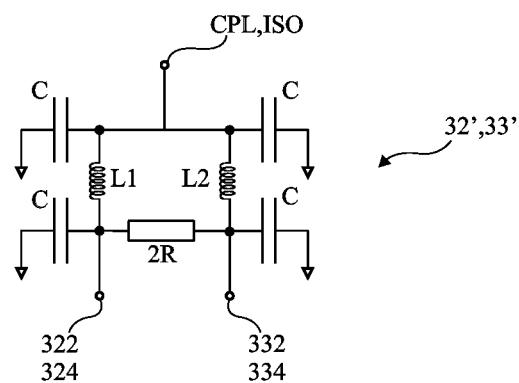
FIG. 7 illustrates an embodiment of a splitter of the coupler of FIG. 5.

FIG. 7 shows another example of splitter 32', 33' formed of a resistive, inductive, and capacitive network. In this example, terminal CPL (or ISO) is connected to terminals 322 (324) and 332 (334) by an inductance, respectively L1, L2. Terminals 322 and 332 (324 and 334) are connected by a resistive element 2R (R representing the impedance matching value). Finally, the respective ends of each inductive element L1, L2 are grounded by a capacitive element C.

The operation of the splitters of FIGS. 6 and 7 is known per se.

More generally, the principle used to operate coupling circuit 3 of FIG. 5 may be transposed to the use of a single distributed coupler 31 for several radio paths having different characteristics. In this case, blocks 34 and 35, respectively 36 and 37, interposed between the ends of the coupled line and the output terminals of circuit 3, perform different functions selected according to the desired frequency response in the operating band of the concerned path.

An advantage of the described embodiments is that the use of a single distributed coupler decreases the insertion loss while enabling use of an antenna common to several transmit-receive paths of different nature.

Various embodiments have been described. Various alterations, modifications, and improvements will occur to those skilled in the art. In particular, although reference has been made to an example intended for telecommunications in bands 1G to 4G, the described embodiments easily transpose to other frequency bands. Further, the practical implementation of the described embodiments is within the abilities of those skilled in the art based on the functional indications given hereabove and by using current filter and coupler manufacturing techniques.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A coupling circuit comprising:
   a coupler comprising a first conductive line and a second conductive line coupled to the first conductive line;
   at each end of the second line of the coupler, a two-output signal splitter; and
   at each output of each splitter, a filtering function.

2. The circuit of claim 1, wherein the first conductive line of the coupler is intended to be interposed on a transmission line of a radio transmit-receive chain.

3. The circuit of claim 1, wherein the respective outputs of the filtering functions are connected to detection circuits, respectively assigned to different radio transmit-receive paths.

4. The circuit of claim 1, wherein first outputs of each splitter are processed by a low-pass filter.

5. The circuit of claim 4, wherein second outputs of each splitter are processed by a correction filter.

6. A radio transmission chain comprising:
   two paths sharing a same antenna; and
   a coupling circuit including:
      a coupler comprising a first conductive line and a second conductive line; coupled to the first conductive line;
      at each end of the second line of the coupler, a two-output signal splitter; and
      at each output of each splitter, a filtering function.

\* \* \* \* \*